April 23, 1963 R. F. LIPSCOMB 3,086,652
HANDLING CARDS FOR COMPONENTS
Filed July 26, 1961
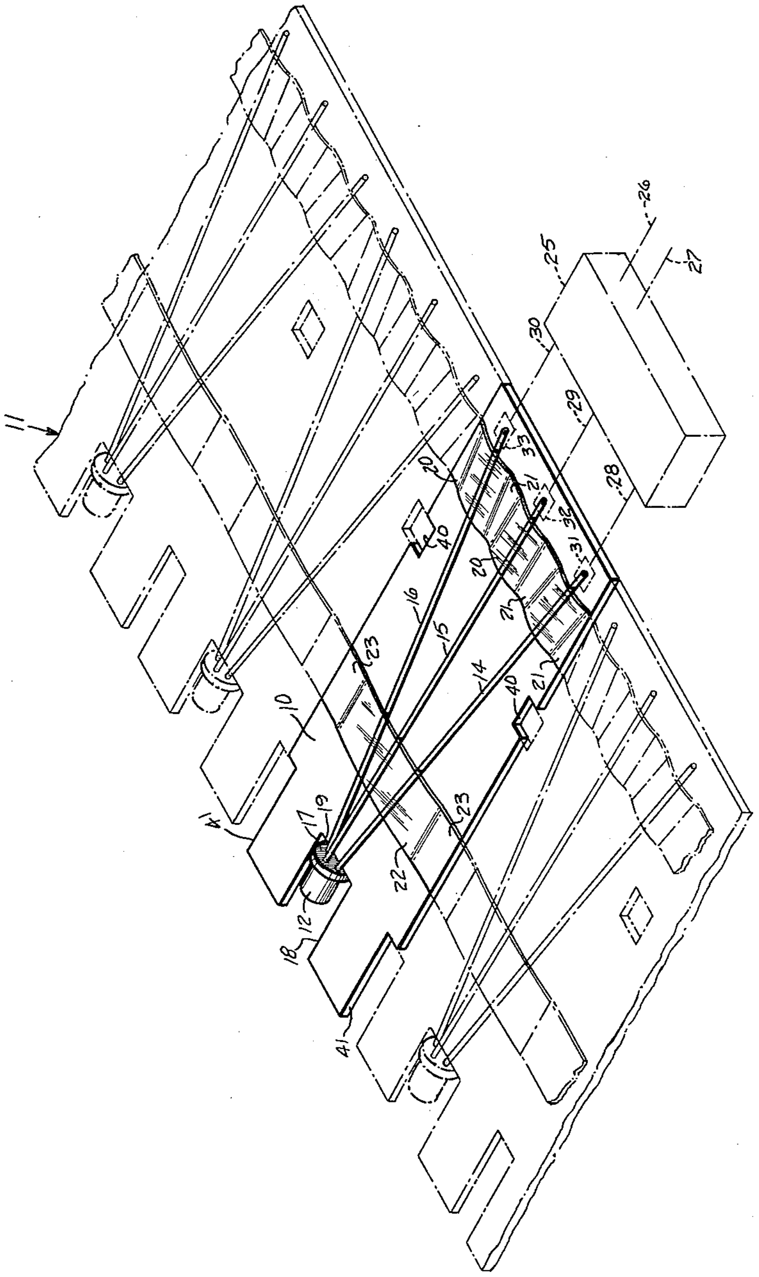
INVENTOR
R.F. LIPSCOMB
By W. Johnson
ATTORNEY

United States Patent Office 3,086,652
Patented Apr. 23, 1963

3,086,652
HANDLING CARDS FOR COMPONENTS

Robert F. Lipscomb, Reading, Pa., assignor to Western Electric Company, Incorporated, a corporation of New York Filed July 26, 1961, Ser. No. 127,023
2 Claims. (Cl. 206—80)

This invention relates to handling cards for components, particularly components having groups of leads extending from one end thereof.

In the manufacture of certain types of electrical components, they are initially constructed with groups of elongated leads extending from one end thereof and must be subjected to numerous tests at different stations. This necessitates not only a means for supporting the components while moving relative to the various testing means, but also the accurate spacing and the maintenance of the leads in predetermined positions relative to each other so that these tests may be performed.

An object of the present invention is a handling card which is highly practical for supporting an electrical component and holding the leads thereof in predetermined spaced positions.

In accordance with the object, the invention comprises a handling card for a component having a plurality of leads extending from one end thereof, the card being apertured at one end to receive the component and comprising a spacing tape traversing the surface on which the leads are caused to lie, the tape being positioned free of the leads and secured firmly to the surface at opposing sides of the leads to hold their respective leads in spaced positions.

Other objects and advantages will be apparent from the following detailed description when considered in conjunction with the accompanying drawing wherein:

The single FIGURE is an isometric view of handling cards, a selected one being shown in solid lines.

The handling card, shown in the drawing, may be formed singly of the contour shown at 10 in solid lines or it may be formed from a series of operations from a strip of material, indicated generally at 11, and subsequently cut into individual cards. The strip or card is formed of a suitable dielectric material which initially may be wound on a drum or reel but when cut into individual cards, it will have sufficient rigidity for protective handling of the component 12 with its group of elongated leads 14, 15, and 16 which extend from one end 17 of the component.

The card 10 has an aperture 18 formed in one end thereof to receive the component to locate it against the surface 19 of the aperture and to partially surround the component to provide alignment and to protect the component during handling. The leads 14, 15, and 16 are spaced in their respective order from each other, as illustrated in the drawing, and it is important that the leads be retained in this spaced position for further processing or testing of the component. This is accomplished by a spacing tape 20 extending transversely of the card 10 short of the ends of the leads and secured at various positions, not to the leads, but to the surface of the card. These securing positions are indicated at 21 at opposite sides of each lead, this being accomplished through a suitable heating process applied at these positions. A holding tape 22 is also secured, not to the leads but to the surface of the card, at positions 23 to assist in retaining the component and its leads in position on the card for movement through subsequent processing or testing stations.

As an example of one of these stations, a test set 25 is shown schematically with incoming leads 26 and 27 from a suitable power supply, not shown, and other leads 28, 29, and 30 extending from the test set to contacts 31, 32, and 33 positioned to engage their respective leads 14, 15, and 16 of the component 12. Although the contacts are shown engaging the ends of the leads, they may be positioned to engage any of the spaced portions of the leads nearer the component.

Suitable means, such as notches 40 and 41, may be employed in cooperation with locating means to locate the leads of each card in engagement with the contacts of the test set.

The handling card 10, when provided with its spacing tape 20 and holding tape 22, will retain the component 12 in the protected area of the aperture 18 with the one end 17 of the component from which the group of leads extends abutting against the surface 19 of the aperture. In this manner, the handling card adapts the component for movement through numerous testing or processing stations with its respective elongated leads accurately positioned at all times relative to each other. However, when the component has completed all of these tests and has been shipped to remote positions for installation in equipment of which it is to be a part, the component may be removed readily from the card because physically, it is not secured to the card by either tape 20 or 22, but it is merely held in position by the tapes lying in close engagement with, but not secured to, the leads. Therefore, by gripping the component 12 manually and moving it out of the aperture 18, the leads may be removed freely from the tapes 20 and 22.

It is to be understood that the above described arrangements are simply illustrative of the application of the principles of the invention. Numerous other arrangements may be readily devised by those skilled in the art which will embody the principles of the invention and fall within the spirit and scope thereof.

What is claimed is:

1. A handling card for a component having a group of leads extending from one end thereof comprising:
   - a flat card-like body of dielectric material having an aperture in one end thereof receiving the component, and an edge of the aperture against which the component is located so that the leads will lay in spaced positions on a flat surface of the body and extend toward an end of the body opposing the end of the body with the aperture, and
   - a spacing tape traversing all of the leads of the component and secured only to the flat surface of the body at opposing sides of each lead of the group of leads to hold the leads at predetermined spaced positions on the flat surface of the body for testing of the component through the leads.

2. A handling card for a component according to claim 1 in which:
   - the spacing tape is located near the end of the body opposing the aperture but short of the ends of the group of leads, and
   - a holding tape traversing the leads between the spacing tape and the aperture and secured to the flat surface of the body at positions beyond and free of the leads to hold the component in the aperture and condition the component and leads for removal free of the card-like body as they are not fixed thereto.

References Cited in the file of this patent

UNITED STATES PATENTS

| | | |
|---|---|---|
| 456,335 | Mulloy | July 21, 1891 |
| 465,793 | Mackie | Dec. 22, 1891 |
| 1,929,167 | Goldsmith | Oct. 3, 1933 |
| 2,335,015 | Lantheaume | Nov. 23, 1943 |
| 2,881,911 | Krill | Apr. 14, 1959 |
| 2,984,347 | Kalinchuk | May 16, 1961 |